US009048201B2

(12) United States Patent
Hui et al.

(10) Patent No.: US 9,048,201 B2
(45) Date of Patent: Jun. 2, 2015

(54) SACRIFICIAL WAFER PROBE PADS THROUGH SEAL RING FOR ELECTRICAL CONNECTION TO CIRCUIT INSIDE AN INTEGRATED CIRCUIT

(75) Inventors: Frank Hui, San Jose, CA (US); Neal Kistler, Laguna Niguel, CA (US); Don Bautista, Ladera Ranch, CA (US)

(73) Assignee: Broadcom Corporation, Irvine, CA (US)

( * ) Notice: Subject to any disclaimer, the term of this patent is extended or adjusted under 35 U.S.C. 154(b) by 437 days.

(21) Appl. No.: 13/167,152

(22) Filed: Jun. 23, 2011

(65) Prior Publication Data
US 2012/0326146 A1 Dec. 27, 2012

(51) Int. Cl.
H01L 23/544 (2006.01)
H01L 23/58 (2006.01)
H01L 29/00 (2006.01)
H01L 21/44 (2006.01)
H01L 21/66 (2006.01)

(52) U.S. Cl.
CPC .............. *H01L 22/32* (2013.01); *H01L 23/58* (2013.01); *H01L 2924/0002* (2013.01)

(58) Field of Classification Search
CPC ... H01L 23/58; H01L 22/32; H01L 2924/002; H01L 2924/00
USPC .................. 257/48, 536, 538, 620, E21.001, 257/E23.002, E29.325, 638, E21.004; 438/113, 382, 383, 458, 462
See application file for complete search history.

(56) References Cited

U.S. PATENT DOCUMENTS

| | | | | |
|---|---|---|---|---|
| 5,059,899 | A | * | 10/1991 | Farnworth et al. .............. 438/18 |
| 6,838,891 | B2 | * | 1/2005 | Ohya et al. ................. 324/750.3 |
| 6,992,327 | B2 | * | 1/2006 | Tone et al. ....................... 257/48 |
| 2009/0121321 | A1 | * | 5/2009 | Miccoli et al. ................ 257/618 |

* cited by examiner

*Primary Examiner* — Hung Vu
(74) *Attorney, Agent, or Firm* — Sterne, Kessler, Goldstein & Fox PLLC

(57) ABSTRACT

The disclosure is directed to a semiconductor wafer, integrated circuit product, and method of making same, having multiple non-singulated chips separated by scribe lines, comprising a plurality of seal rings, each seal ring surrounding a corresponding chip and disposed between the corresponding chip and adjacent scribe lines. Well resistors are disposed below the seal rings and probe pads disposed in the scribe lines. In particular, at least one of the probe pads is coupled by at least one of the well resistors to at least one of the chips.

31 Claims, 5 Drawing Sheets

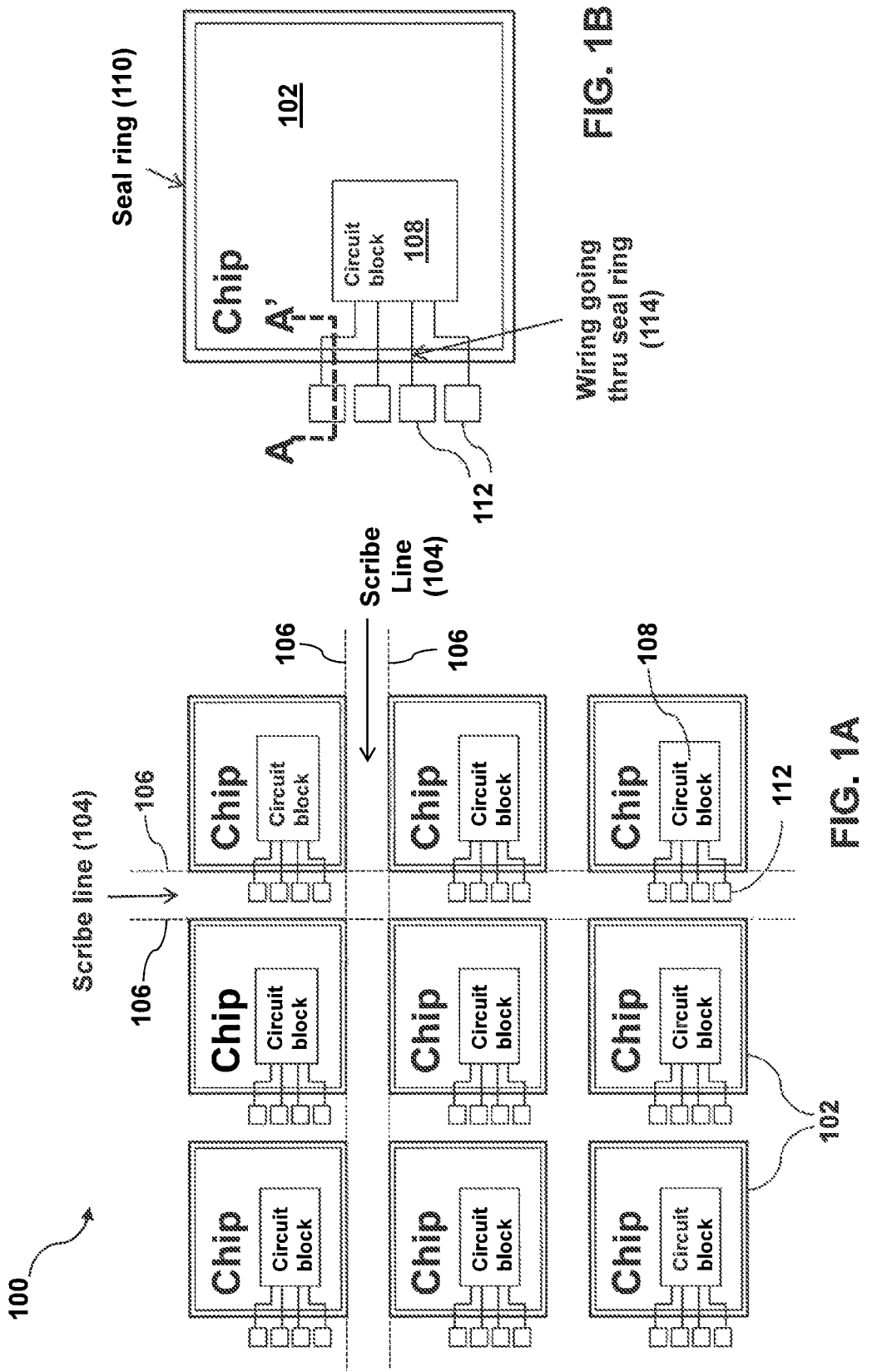

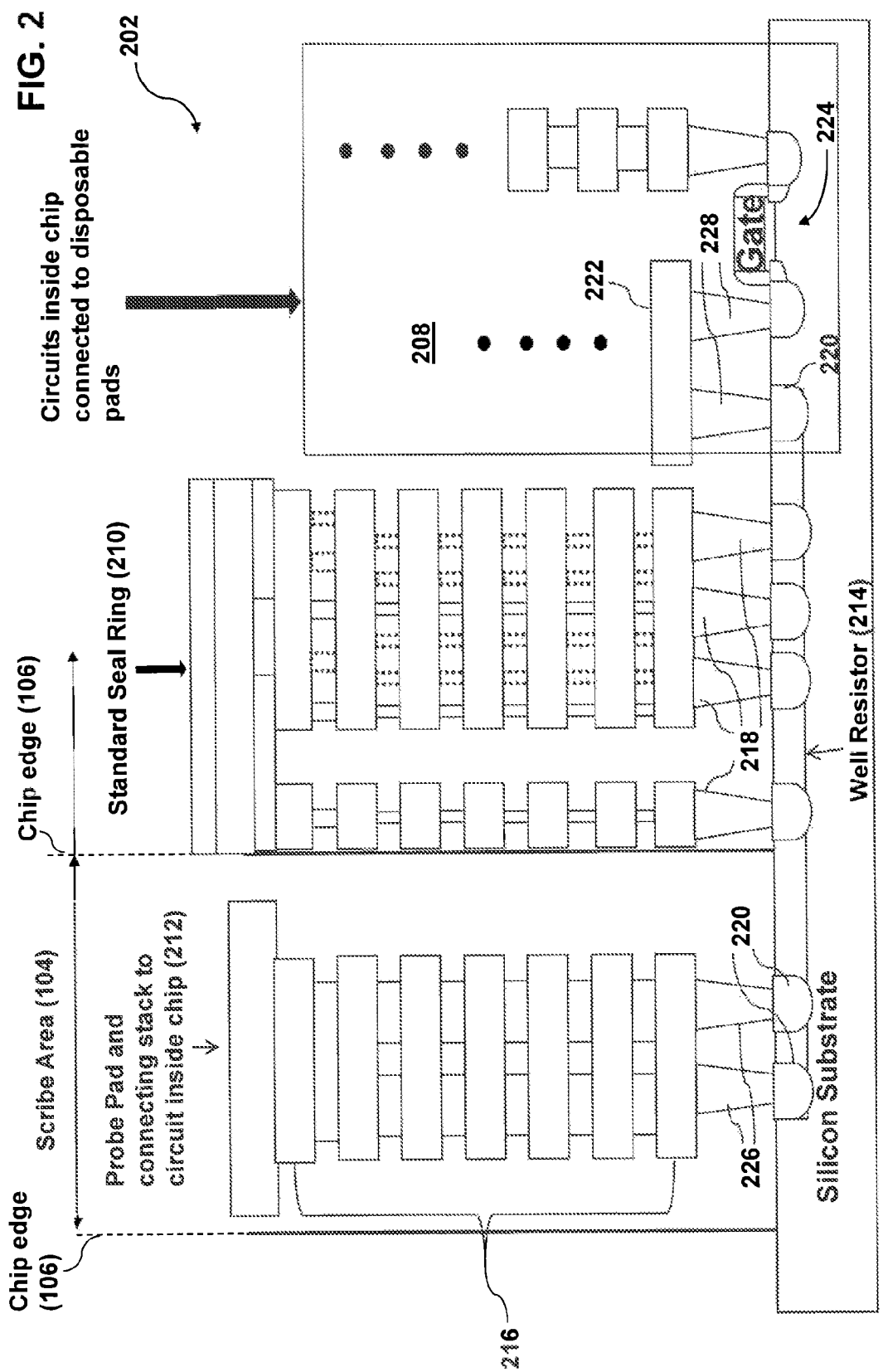

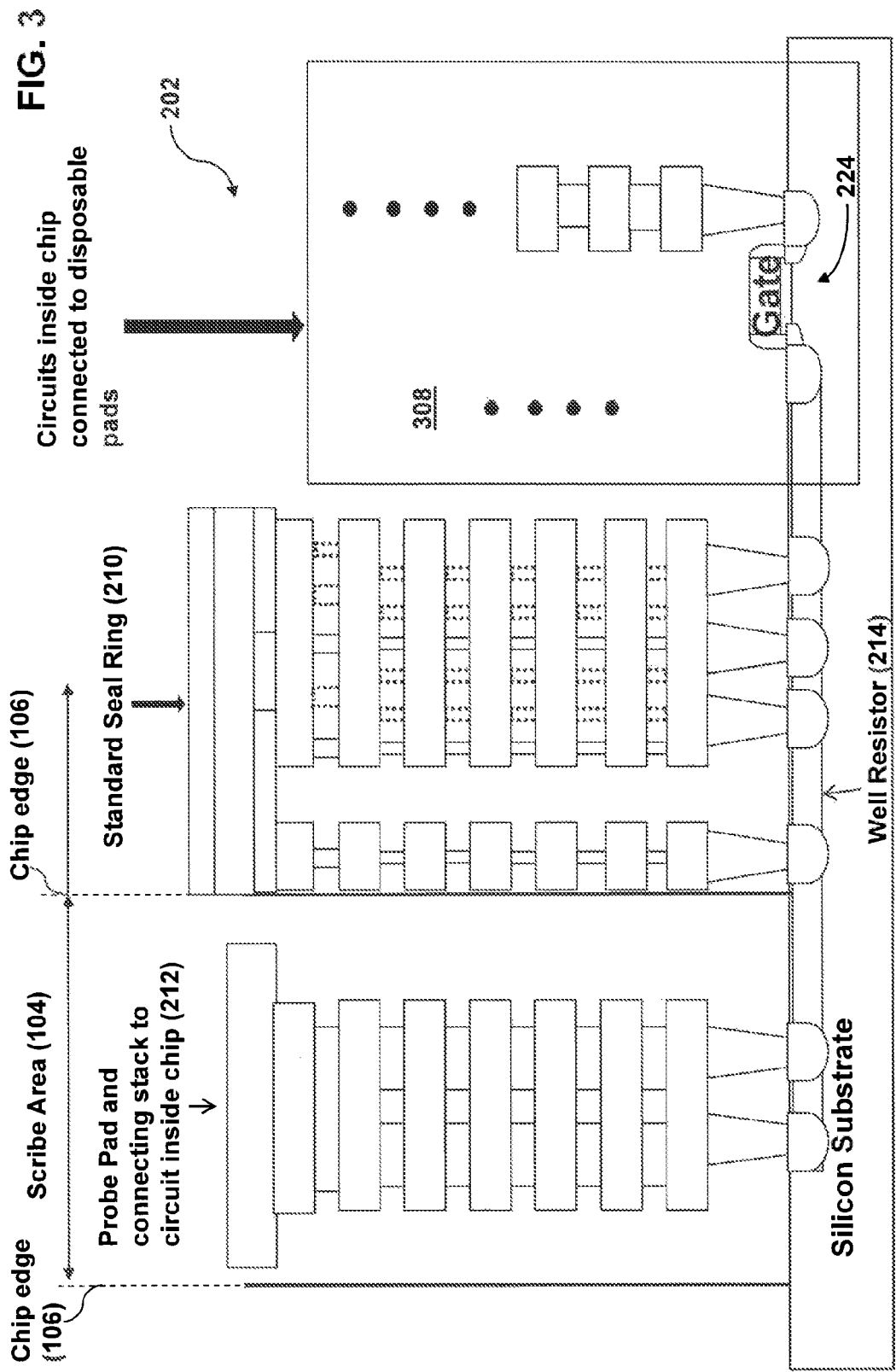

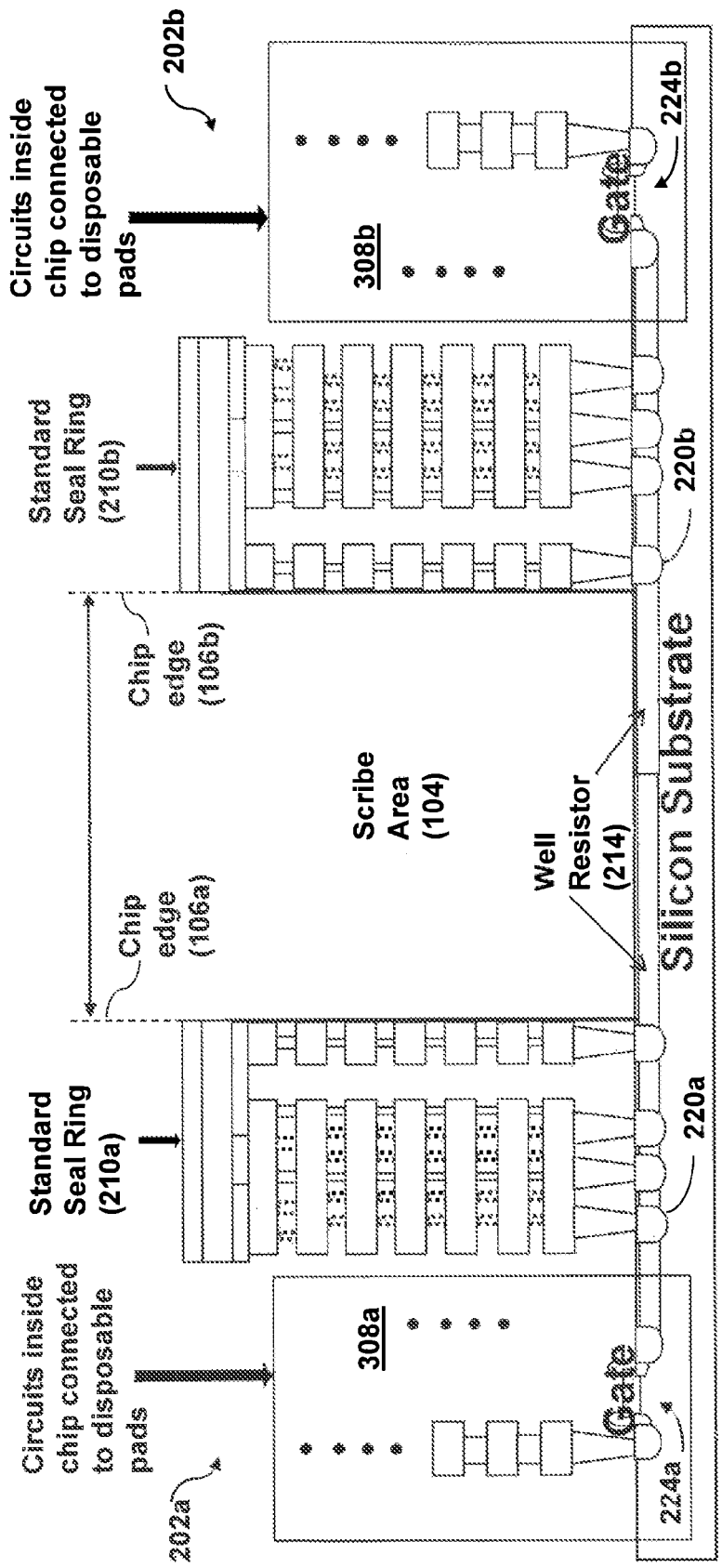

SACRIFICIAL WAFER PROBE PADS THROUGH SEAL RING FOR ELECTRICAL CONNECTION TO CIRCUIT INSIDE AN INTEGRATED CIRCUIT

BACKGROUND OF THE INVENTION

1. Field of the Invention

The present invention deals with electrical connection to a circuit inside an integrated circuit that is protected by a seal ring.

2. Background Art

Semiconductor integrated circuits (ICs) are formed on substrates, such as silicon wafers or insulators, and typically comprise a variety of basic electrical components, such as transistors, resistors, capacitors, and the like. The fabricated components are then interconnected using metal layers, and the like. The ICs are formed on the wafer are in repeatable patterns arranged in a grid pattern separated by scribe areas (also called scribe "alleys," "lanes," "lines," "streets," etc.). Once the wafer is completely processed, it is cut up (also called "diced" or "singulated") into the individual chips (die). Each die is mounted in a package and the terminals of the die are connected to the package terminals through a wire bonding operation.

It is desirable to verify that such integrated circuit components are fabricated according to a design specification and have certain properties or values, e.g., a specified gain, resistance, capacitance, etc. Such a quality control methodology is referred to as "wafer acceptance testing" or "in-process electrical testing." It is also desirable to program certain integrated circuit components at the wafer lever before singulation. Probe (or "test") pads are provided in the scribe lines for both wafer acceptance testing and wafer-level programming.

A metallized "seal ring" is typically formed around the outside of individual chips to isolate and protect them (electrically and/or environmentally). However, the use of seal rings complicates wafer acceptance testing and wafer-level programming. What is needed is a technique to connect the circuits within the chips to the probe pads after the seal ring is implemented.

BRIEF SUMMARY

In an embodiment, the invention is directed to a semiconductor wafer having multiple non-singulated chips separated by scribe lines, comprising a plurality of seal rings, each seal ring surrounding a corresponding chip (also called "IC" or "die" herein) and disposed between the corresponding chip and adjacent scribe lines. Well resistors are disposed below the seal rings, and probe pads disposed in the scribe lines. In particular, at least one of the probe pads is coupled by at least one of the well resistors to at least one of the chips.

The well resistors may comprise doped regions disposed within the wafer.

The probe pads may comprise sacrificial probe pads that are destroyed when the wafer is diced.

The seal rings may include a bottom metallization layer electrically isolated from the corresponding chip.

The invention may further comprise a connecting stack to couple the at least one probe pad to the at least one well resistor, wherein the at least one probe pad and the connecting stack are disposed in the same scribe lane.

Additionally, the invention may further comprising a connecting stack to couple the at least one probe pad to the at least one well resistor, wherein the at least one probe pad is disposed in a first scribe line and at least a portion of the connecting stack is disposed in an adjacent intersecting scribe line.

In another embodiment, an integrated circuit product has multiple non-singulated chips separated by scribe lines, and includes a plurality of seal rings, each seal ring surrounding a corresponding chip and disposed between the corresponding chip and adjacent scribe lines. Well resistors are disposed below the seal rings so as to provide a conductive interconnect between the two or more chips.

In yet an embodiment, the invention is directed to a method of making a semiconductor device having a plurality of chips separated by scribe lines. Well resistors are formed at least between the scribe lines and the chips. Seal rings are formed around each chip, so as to be disposed between the corresponding chip and adjacent scribe lines, and above the well resistors, and probe pads are formed in the scribe lines. Further, at least one of the probe pads is coupled by at least one of the well resistors to at least one of the chips. In this embodiment, the chips are singulated at least at a subset of the scribe lines. For the non-singulated chip-to-chip embodiment, the probe pads are not formed, and the well resistors directly couple two or more chips to form a chip-to-chip conductive interconnect.

These and other advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1A shows a semiconductor wafer 100 comprising a plurality of chips 102 separated by scribe lines 104, according to embodiment(s) of the present invention.

FIG. 1B shows an expanded view of a chip 102 according to FIG. 1A.

Figure 1C:
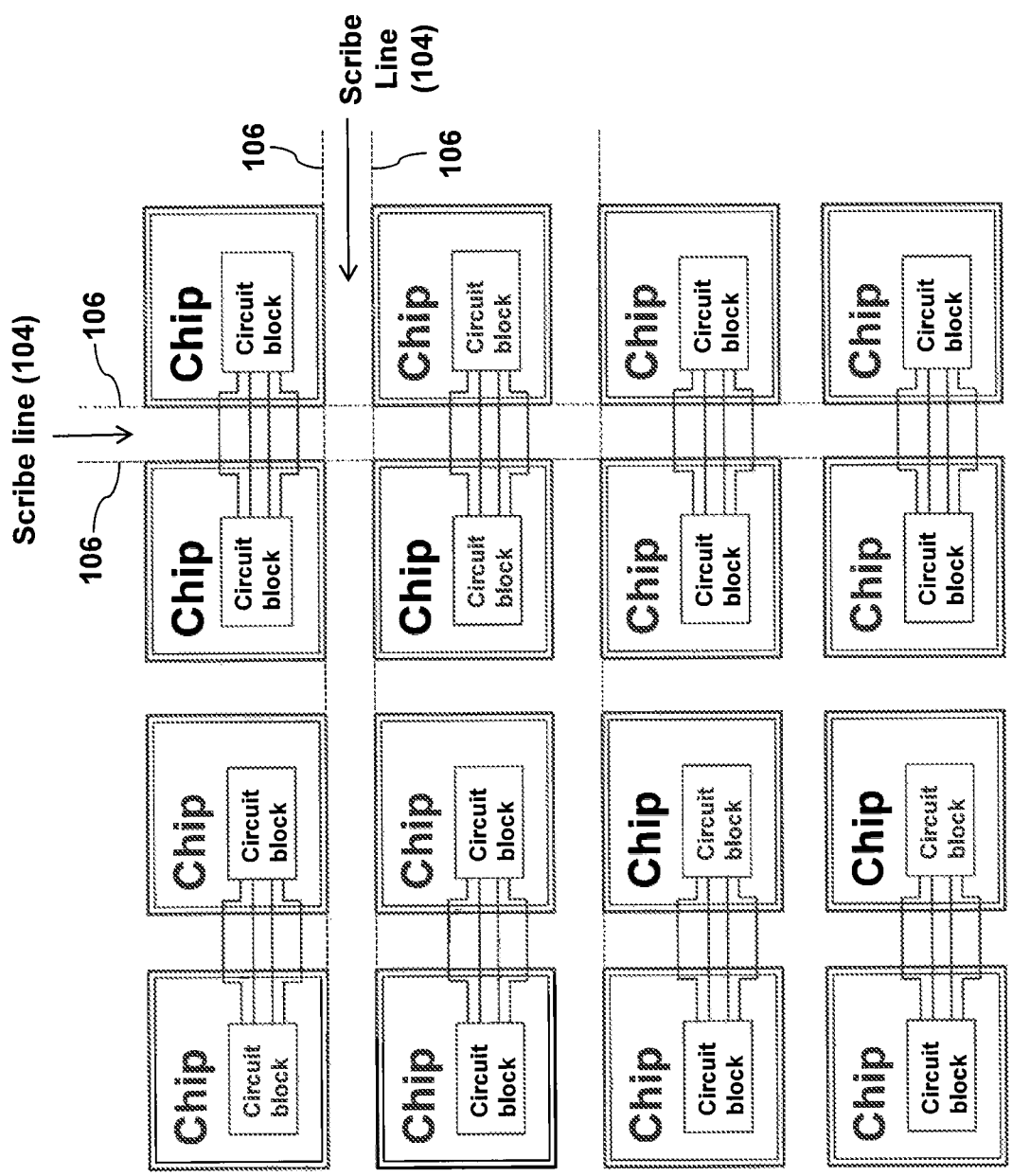
FIG. 1C illustrates a chip-to-chip interconnect, according to embodiments of the present invention.

FIG. 2 shows a chip 202 coupled to a circuit 208 by a well resistor 214 under seal ring 210, according to embodiment(s) of the present invention.

FIG. 3 shows chip 202 coupled to a circuit 308 by a well resistor 214 under seal ring 210, according to embodiment(s) of the present invention.

FIG. 4 further illustrates a chip-to-chip interconnect using a well resistor that disposed beneath the seal rings of adjacent chips, according to embodiments of present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

For the sake of brevity, conventional electronics, manufacturing of CMOS logic and the like, and other functional aspects of the method/apparatus (and components of the individual operating components of the apparatus) may not be described in detail herein. It should be appreciated that many other manufacturing techniques could be used to create the structures described herein, and that the techniques described herein could be used in connection with other devices. Moreover, it should be understood that the spatial descriptions (e.g., "next to," "above," "below," "up," "down," etc.) made herein are for purposes of illustration only.

Moreover, the terms die, chip, integrated circuit, monolithic device, semiconductor device and microelectronic device are often used interchangeably in this field. The present invention is applicable to all of the above as they are generally understood in the field.

The terms pins, pads and leads refer to input and/or output terminals of a connector, device, chip, printed circuit, or the like, which are used to provide electrical connection to one or more connectors, devices, chips, printed circuits, or the like. In this disclosure, however, "disposable probe pads," "sacrificial probe pads," "test pads" or simply "probe pads" are used interchangeably and refer to those pads located in/on scribe lines, in contrast to "contact pads" used for connectivity to chips after dicing.

The terms metal line, trace, wire, conductor, signal path and signaling medium are all related. These related terms are generally interchangeable and appear in order from most specific to most general. In this field, metal lines are sometimes referred to as traces, wires, lines, interconnect or simply metal. Metal lines, generally aluminum (Al) or an alloy of Al and copper (Cu), and the like, are conductors which provide signal paths for coupling, or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), or refractory metal silicides are examples of other conductors. Signaling medium is the most general term and encompasses the others.

Seal rings isolate each chip formed on a wafer from the scribe lines, and thus from each other. An embodiment of the present invention allows electrical signals to bypass such seal rings at the wafer acceptance test stage for wiring/programming and/or reading to/from the chips. This electrical connection is achieved using a well resistor beneath the seal ring and the sacrificial probe pads located at the scribe lines between the chips. Alternatively, in a further embodiment, the well resistors and probe pads are used to pass signals between chips that are not singulated but are packaged together.

FIG. 1A shows an exemplary semiconductor wafer 100 comprising a plurality of chips 102 separated by scribe lines 104. The edge 106 of each chip 102 is defined by the scribe lines 104. Each chip 102 comprises at least one circuit block 108, connected to probe pads 112, according to embodiments of the present invention. FIG. 1B shows an expanded view of a chip 102 of FIG. 1A.

Specifically, FIG. 1B shows a circuit block 108 electrically coupled to a plurality of sacrificial probe pads 112 by wiring 114. The chip 102 and sacrificial probe pads 112 are separated by a seal ring 110. (Each chip 102 comprises a seal ring, as illustrated in FIG. 1A.) The number of chips 102, the size of the scribe lines 104, details of the circuit blocks 108, number of sacrificial pads 112, and the like, are all application-specific details as would be apparent to a person having ordinary skill in the art. FIGS. 2 and 3 show further details of circuit block 108, sacrificial probe pad 112 and the wiring 114 in a cross-section taken through dashed-line A-A' of FIG. 1B.

FIG. 2 shows a chip 202 having a circuit 208 coupled to a probe pad 212 by a well resistor 214 under seal ring 210, according to embodiments of the present invention. As illustrated in this figure, scribe area (line) 104 is separated from the circuit 208 inside chip 202 by the seal ring 210. As in FIGS. 1A and 1B, chip edges are defined by boundaries 106. In this example, probe pad 212 comprises a top pad and a plurality of metal layers and vias (as illustrated at 216). The seal ring is also composes of a number metal layers and provides a hermetic mechanical seal around the circuit portion 208 of the chip 202. The metal layers and vias 216 may be co-disposed during manufacturing with one or more portions of seal ring 210 and metallization layers 222 of circuit 208 by the use of photolithography patterning and subsequent processing techniques, as would be apparent to a person having ordinary skill in the art.

FIG. 2 depicts the wiring 114 (in FIG. 1B) as a well resistor 214. In an exemplary embodiment in which the substrate comprises P-type doped material, the well resistor 214 comprises an n-type doped well of sufficient conductivity to pass a signal between the probe pad 212 and the circuit 208. Other complementary doping types and implementations of well resistor 214 will become apparent to a person having ordinary skill in the art based on the disclosure herein.

According to the present invention, the well resistor 214 is electrically isolated from the seal ring 210, as shown at 218. For example, one or more interconnect vias 218 between a bottom metallization layer of seal ring 210 do not undergo silicidation. (Silicidation is required to make the interconnect vias 218 conductive, otherwise they only provide a sealed mechanical contact along with the other metal layers of the seal ring.) In other words, there is no silicide formed in the region 218 to electrically connect the well resistor 214 to the seal ring 210, and therefore the well resistor 214 is isolated from the metal layers of metallic seal ring 210.

Highly doped (e.g., n+-type) surface contact regions 220 permit well resistor 214 to function as an electrical conductor between sacrificial probe pad 212 and circuit 208. Unlike interconnect vias 218 coupled to the seal ring 210, interconnect vias 226 do undergo silicidation during processing, and therefore are conductive and do provide good electrical contact between the sacrificial probe pads 212 and the well resistor 214. Similarly, the interconnect vias 228 also undergo silicidation during processing so that they are conductive and provide a good electrical contact between the contact regions 220 in the silicon substrate and corresponding portions of circuit 208, such as metal layer interconnect 222 and gate device (e.g. transistor) 224.

Therefore, the interconnect vias 226, well resistor 214, and interconnect vias 228 form a sufficiently conductive path between sacrificial probe pad 212 and circuit 208 that travels beneath seal ring 210, such that wafer acceptance testing and/or chip programming can be performed even after the seal ring is installed. It is noted that the well resistor 214 is a resistive layer (as opposed to a metal layer) and therefore not an ideal conductor. However, the conductivity of the layer 214 is sufficient for wafer acceptance testing and/or chip programming. FIG. 3 shows probe pad 212 coupled to circuit 308, which simply comprises a gate device (e.g., transistor) 224.

In other embodiments of the present invention, the probe pad can be located at the intersection of two scribe lines between two or more chips. Alternatively, the probe pad can be formed in the shape of an "L" so as to wrap around the corner of a chip at the intersection of two scribe lines. Thus, a given sacrificial probe pad may connect two or more chips using one or more well resistors.

In addition to allowing for electrical data writing/reading of one or more chips at the wafer acceptance test stage, the present invention covers an integrated circuit product comprising plural non-singulated chips separated by scribe lines and absent any probe pads, as shown in FIG. 1C. In this embodiment, two, four, 16, or more non-singulated chips may be packaged together and have the scribe lines therebetween. In this manner, well resistors would function as interconnects between the non-singulated packaged chips. For example, active devices in two different non-singulated 1C dies could be connected together using the well resistor, as shown in FIG. 4 discussed below.

FIG. 4 illustrates chips 202a and 202b having corresponding seals rings 210a and 210b. Well resistor 214 disposed beneath the seal rings 210a and 210b and provides a conductive path between active devices 224a and 224b of chips 202a and 202b. As discussed above, the metal layers of the seal rings 210 are electrically isolated from the well resistor 214 by precluding silicidation of their respective interconnect vias 218.

The present invention is also directed to a method of making a semiconductor wafer or an integrated circuit product as described above. Well resistors are formed at least between the scribe lines and the chips. Seal rings are formed around the chips so as to be disposed between a corresponding chip and adjacent scribe lines, and above the well resistor(s). The probe pads are formed in the scribe lines such that at least one of the sacrificial probe pads is coupled by at least one of the well resistor to at least one of the chips. The chips may be individually singulated or diced into non-singulated groups.

When the probe pads are formed, silicide is applied during the formation of the interconnecting vias between the bottom metal layer of the probe pad and the corresponding highly doped regions in the silicon substrate that connect to the well resistor, and therefore provide a conductive contact between the probe pad and the well resistor. Silicide is similarly used for the contacts between the internal circuit and the well resistor. When the seal ring is formed, silicide is not applied during the formation of the interconnecting vias between the bottom metal layer of the seal ring and the highly doped regions in the silicon substrate that connect to the well resistor, and therefore the seal ring is isolated from the well resistor 214.

Conclusion

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Thus, the breadth and scope of the present invention should not be limited by any of the above-described exemplary embodiments, but should be defined only in accordance with the following claims and their equivalents.

What is claimed is:

1. A semiconductor wafer having multiple non-singulated chips separated by scribe lines, comprising:
   a plurality of seal rings disposed on a surface of a semiconductor substrate, each seal ring surrounding a corresponding chip and disposed between the corresponding chip and adjacent scribe lines;
   probe pads disposed in the scribe lines; and
   a plurality of doped regions disposed in the semiconductor substrate, each of the plurality of doped regions configured to form a corresponding well resistor,
   wherein at least one of the well resistors extends from at least one of the chips to at least one of the probe pads and having a portion that passes directly under a corresponding seal ring of the plurality of seal rings, so as to couple the at least one of the probe pads to the at least one of the chips.

2. The semiconductor wafer of claim 1, wherein the probe pads comprise sacrificial probe pads that are destroyed when the wafer is diced.

3. The semiconductor wafer of claim 1, wherein each seal ring comprises a bottom metallization layer electrically isolated from the corresponding chip.

4. The semiconductor wafer of claim 1, further comprising a connecting stack to couple the at least one probe pad to the at least one of the well resistors, wherein the at least one probe pad and the connecting stack are disposed in the same scribe line.

5. The semiconductor wafer of claim 1, further comprising a connecting stack to couple the at least one probe pad to the at least one of the well resistors, wherein the at least one probe pad is disposed in a first scribe line and at least a portion of the connecting stack is disposed in an adjacent intersecting scribe line.

6. The semiconductor wafer of claim 1, further comprising a conductive interconnect via between a bottom metal layer of the at least one probe pad and the at least one of the well resistors.

7. The semiconductor wafer of claim 6, wherein the conductive interconnect via includes silicide or is formed using silicide.

8. The semiconductor wafer of claim 1, further comprising a non-conductive interconnect via between a bottom layer of at least one of the seal rings and the at least one of the well resistors.

9. The semiconductor wafer of claim 8, wherein the non-conductive interconnect via does not include silicide, and therefore is non-conductive.

10. The semiconductor wafer of claim 1, wherein the at least one probe pad is coupled by the at least one of the well resistors to an active device of the corresponding chip.

11. The semiconductor wafer of claim 1, wherein the well resistors are disposed in the semiconductor substrate.

12. The semiconductor wafer of claim 1, wherein a first seal ring defines an inner portion of the corresponding chip encapsulated by the first seal ring and defines an outer portion of the corresponding chip that is not encapsulated by the first seal ring, and wherein the at least one of the well resistors extends from the inner portion to the outer portion.

13. The semiconductor wafer of claim 1, wherein the at least one of the well resistors is directly connected to the corresponding seal ring, and wherein the at least one of the well resistors is electrically isolated from the corresponding seal ring.

14. The semiconductor wafer of claim 1, further comprising a circuit element disposed on the corresponding chip, the circuit element directly contacting the at least one of the well resistors, wherein the at least one probe pad directly contacts the at least of the well resistors so as to be electrically connected to the circuit element via the at least one of the well resistors.

15. An integrated circuit product having multiple non-singulated chips separated by scribe lines, comprising:

a plurality of seal rings disposed on a surface of a semiconductor substrate, each seal ring surrounding a corresponding chip and disposed between the corresponding chip and adjacent scribe lines; and a plurality of doped regions disposed in the semiconductor substrate, each of the plurality of doped regions configured to form a corresponding well resistor, wherein two or more chips are electrically coupled by at least one well resistor so as to provide a conductive interconnect between the two or more chips, and wherein the at least one well resistor extends from a first chip of the two or more chips to a second chip of the two or more chips and having a portion that passes directly under a corresponding seal ring of the plurality of seal rings.

16. The integrated circuit product of claim 15, wherein each seal ring comprises a bottom metallization layer electrically isolated from the corresponding chip.

17. The integrated circuit product of claim 15, wherein the doped regions are electrically isolated from metal layers of the seal rings.

18. A method of making a semiconductor wafer having a plurality of chips separated by scribe lines, comprising:

forming a plurality of doped regions in a semiconductor substrate, each of the plurality of doped regions configured to form a corresponding well resistor;

forming a seal ring on a surface of the semiconductor substrate around a corresponding chip so as to be disposed between the corresponding chip and adjacent scribe lines; and forming probe pads in the scribe lines, wherein at least one of the well resistors extends from the corresponding chip to the at least one probe pad and having a portion that passes directly under the seal ring.

19. The method of claim 18, further comprising singulating the chips at least at a subset of the scribe lines.

20. The method of claim 18, wherein forming the probe pads comprises forming a conductive interconnect via between a bottom metal layer of the at least one probe pad and the at least one of the well resistors.

21. The method of claim 20, wherein the conductive interconnect via includes silicide or is formed using silicide.

22. The method of claim 18, wherein forming the seal ring further comprises forming a bottom metallization layer electrically isolated from the corresponding chip.

23. The method of claim 22, wherein forming the seal ring comprises forming a non-conductive interconnect via between a bottom metal layer of the seal ring and the at least one of the well resistors.

24. The method of claim 18, further comprising coupling the at least one probe pad by a second one of the well resistors to a second chip.

25. The method of claim 18, further comprising forming connecting stacks to couple the probe pads to the well resistors.

26. An integrated circuit product, comprising:

a silicon substrate having a doped region configured to form a well resistor;

an integrated circuit chip disposed on the silicon substrate and encapsulated by a seal ring formed on a surface of the silicon substrate; and a probe pad located in a scribe area adjacent to the seal ring, wherein the well resistor extends from the probe pad to an internal circuit of the integrated circuit chip, the well resistor having a portion that passes directly under the seal ring.

27. The integrated circuit product of claim 26, wherein the well resistor is mechanically connected to a bottom metal layer of the seal ring, but electrically isolated from the bottom metal layer of the seal ring.

28. The integrated circuit product of claim 26, further comprising:

a conductive interconnect between a bottom metal layer of the probe pad and the well resistor; and a non-conductive interconnect between a bottom metal layer of the seal ring and the well resistor.

29. A semiconductor wafer having a first chip and a second chip separated by a scribe line, the wafer comprising:

a semiconductor substrate having a doped region that defines a well resistor;

a seal ring disposed on a surface of the semiconductor substrate about a circumference of the first chip, and separating the first chip from the scribe line;

a probe pad disposed in the scribe line, the probe pad directly contacting the well resistor; and a first circuit element disposed on the first chip, the first circuit element directly contacting the well resistor, wherein the well resistor extends from the probe pad to the first chip, the well resistor having a portion that passes directly under the seal ring.

30. The semiconductor wafer of claim 29, wherein the well resistor is directly connected to the seal ring, and wherein the well resistor is electrically isolated from the seal ring.

31. The semiconductor wafer of claim 30, wherein the well resistor is connected to the seal ring via a non-conducting metallization layer of the seal ring.

* * * * *